(12) United States Patent
Yu et al.

(10) Patent No.: US 10,352,981 B2
(45) Date of Patent: Jul. 16, 2019

(54) POWER-CABLE GROUND CURRENT SELF-ADAPTIVE MONITORING METHOD

(71) Applicants: CHANG ZHOU CURRENT SUPPLY COMPANY OF JIANGSU ELECTRIC POWER COMPANY, Changzhou (CN); JIANGSU ELECTRIC POWER COMPANY, Nanjing (CN); STATE GRID CORPORATION OF CHINA, Beijing (CN)

(72) Inventors: Tao Yu, Changzhou (CN); Hui Zhu, Changzhou (CN); Jian Du, Changzhou (CN); Zheng Lu, Changzhou (CN); Hao Wang, Changzhou (CN)

(73) Assignees: CHANG ZHOU CURRENT SUPPLY COMPANY OF JIANGSU ELECTRIC POWER COMPANY, Changzhou (CN); JIANGSU ELECTRIC POWER COMPANY, Nanjing (CN); STATE GRID CORPORATION OF CHINA, Beijing (CN)

( * ) Notice: Subject to any disclaimer, the term of this patent is extended or adjusted under 35 U.S.C. 154(b) by 107 days.

(21) Appl. No.: 14/897,198

(22) PCT Filed: Nov. 27, 2014

(86) PCT No.: PCT/CN2014/092357
§ 371 (c)(1),
(2) Date: Dec. 9, 2015

(87) PCT Pub. No.: WO2015/161651
PCT Pub. Date: Oct. 29, 2015

(65) Prior Publication Data
US 2016/0131693 A1 May 12, 2016

(30) Foreign Application Priority Data
Apr. 24, 2014 (CN) .......................... 2014 1 0169694

(51) Int. Cl.
*G01R 31/02* (2006.01)
*G01R 19/25* (2006.01)

(52) U.S. Cl.
CPC ....... *G01R 31/025* (2013.01); *G01R 19/2513* (2013.01); *G01R 31/021* (2013.01)

(58) Field of Classification Search
CPC .................................................. G01R 31/025
(Continued)

(56) References Cited

U.S. PATENT DOCUMENTS 6,654,216 B2 * 11/2003 Horvath ................ H02H 7/261
361/42
8,447,541 B2 * 5/2013 Rada ........................ G05F 1/70
62/130

(Continued)

FOREIGN PATENT DOCUMENTS

CN   101201379 A   6/2008
CN   201229389 Y   4/2009

(Continued)

OTHER PUBLICATIONS

The World Intellectual Property Organization (WIPO) International Search Report for PCT/CN2014/092357 dated Feb. 26, 2015.

*Primary Examiner* — Ricky Ngon
(74) *Attorney, Agent, or Firm* — Anova Law Group, PLLC

(57) ABSTRACT

The present invention provides a power-cable ground current self-adaptive monitoring method. The steps including configuring a sample baseline, determining an impact factor set of the sample data, sampling real-time data of ground current by a power-cable ground current monitoring system, perform digital filtering on the sampled real-time data of ground current, applying a self-adaptive method to process the filtered sample data, and uploading the processed sample data to a backend monitoring device for real-time monitor- (Continued)

ing. The present invention may solve high energy loss and low information amount problems. The power consumption of monitoring device may be reduced by more than 50%, and server resource occupancy percentage may be lowered by about 20%. Efficiencies of evaluating external insulation status of the are enhanced. The present invention provides a novel grade ranking criterion, which may be dynamically corrected based on actual power-line operations, and reduces objective interferences during value determination process.

11 Claims, 1 Drawing Sheet

(58) Field of Classification Search
USPC .......................................................... 702/58
See application file for complete search history.

(56) References Cited

U.S. PATENT DOCUMENTS

| 2003/0078742 | A1* | 4/2003 | VanderZee | ........... | G01R 21/006 |
| | | | | | 702/60 |
| 2013/0063842 | A1* | 3/2013 | Kataoka | ............... | G01R 31/025 |
| | | | | | 361/42 |

FOREIGN PATENT DOCUMENTS

| CN | 103018630 A | 4/2013 |
| CN | 103529344 A | 1/2014 |
| CN | 103926449 A | 7/2014 |
| EP | 2623998 A2 | 8/2013 |

* cited by examiner

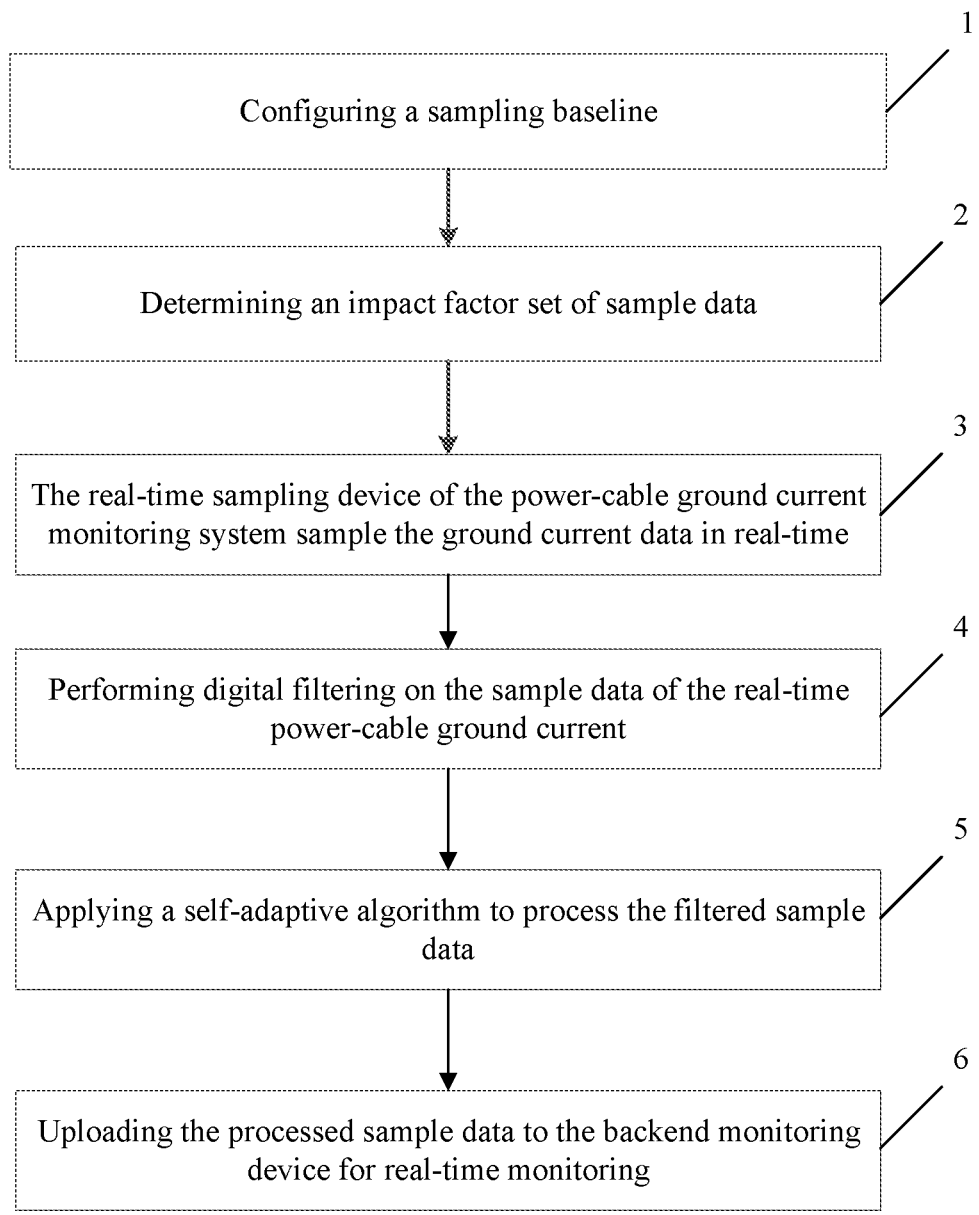

POWER-CABLE GROUND CURRENT SELF-ADAPTIVE MONITORING METHOD

CROSS-REFERENCES TO RELATED APPLICATIONS

This application is a national phase entry under 35 U.S.C. § 371 of International Application No. PCT/CN2014/092357, filed on Nov. 27, 2014, which claims the priority to and benefits of Chinese patent application Serial No. 201410169694.1 filed with the State Intellectual Property Office of P. R. China on Apr. 24, 2014, the entire contents of both of which are incorporated herein by reference.

FIELD OF THE DISCLOSURE

The present disclosure relates to the technical field of monitoring and safety evaluation method for power networks and, more particularly, relates to a power-cable ground current self-adaptive monitoring method.

BACKGROUND

With continuous improvement of urban modernization, power cables, as an important equipment in urban power grid, have been developing at a fast speed. Further, urban power cables are commonly arranged to be laid underground. One of the reasons causing cables failures during practical operations may be faults in a grounding system of power cables, which accounted for 21% of cable failures. The sheath of a power cable may, during usage, be susceptible to external forces, chemical corrosions, lightning overvoltage or system overvoltage, resulting in damaged insulation of the sheath and one or more grounding points, thereby undermining the grounding system of high-voltage cable metal sheath. Induced electromotive force of the cable metal sheath may be unbalanced. The metal sheath and the earth may form a large circulation current. Additional line loss may increase and the cable temperature may increase. When such situation occurs for a long time, the main insulation may be jeopardized and the normal lifespan of cable circuit may be shortened, safety operations of transmission lines are thus affected. To overcome the phenomenon described above, ground cable boxes are commonly used for protection. Further, an online ground current monitoring method may be applied to monitor power-cable ground currents online. After developments in recent years, there are mainly two methods for monitoring ground currents of power cables online.

One method includes pre-configuration and active upload. A monitoring device may be preconfigured with a sampling frequency before installation. The monitoring device may collect data periodically according to the stored preconfigured settings and actively upload the data to a backend database of a monitoring server. The other method includes passive upload upon inquiry. A server in the monitoring center may, based on a frequency set by a user, perform data query and data reading actions on a monitoring device, and record the data in a database. The two strategies may have certain application values, but significant deficiencies still exist. In the first method, sampling is at a fixed frequency. Along with adjustments and changes of power line loads, the first method may not meet the requirements of monitoring power cables in a long term. The other strategy includes controlling the monitoring device to collect and upload data through a backend monitoring server. Although the disadvantage of being unable to adjust sampling frequency is overcome, due to the characteristics of the communication model, corresponding heartbeat signals need to be maintained to keep the links stable, which may increase resource consumption of the server and reduce system expansion performance.

BRIEF SUMMARY OF THE DISCLOSURE

The purpose of the present invention is to overcome the deficiencies of the existing technologies and to provide a power-cable ground current self-adaptive monitoring method that applies data grade ranking and combines relationships between inherent characteristics of cables and the power load, which may solve problems during the monitoring process including high energy loss and low information amount in monitoring data. Further, efficiencies when evaluating external insulation status of the cables and monitoring accuracy may be enhanced.

The technical solution of the present invention is to provide a power-cable ground current self-adaptive monitoring method, which may be implemented by a power-cable ground current monitoring system. The power cable ground current monitoring system may include a power-cable ground current real-time sampling device and a backend monitoring device. The method may include the following steps.

Step (1) A sampling standard or baseline may be configured.

Three-phase induced electromotive forces (EMF) of ground cables A, B, and C corresponding to the three phases may be obtained by:

$$E_B = l/2\omega\left(\ln\frac{2S}{D}\right)\times 10^{-7},$$

$$E_A = E_C = l/\sqrt{\left(2\omega\left(\ln\frac{2S}{D}\right)\times 10^{-7}\right)^2 + 2\omega\left(\ln\frac{2S}{D}\right)\times 10^{-7}\times 2\omega(\ln 2)\times 10^{-7} + (2\omega(\ln 2)\times 10^{-7})^2},$$

In the above equations, D denotes the diameter of the metal layer of the cable; S denotes distance between centers of the cables; l denotes cable length; I denotes cable operating current; and $\omega$ denotes angular frequency.

Based on the three-phase induced electromotive forces, three-phase induced currents $I_1$ may be obtained by:

$$I_{1A} = \frac{E_A}{Z_{OA} + R_1 + R_2 + R_e + X_{he}\times L},$$

$$I_{1B} = \frac{E_B}{Z_{OB} + R_1 + R_2 + R_e + X_{he}\times L},$$

$$I_{1C} = \frac{E_C}{Z_{OC} + R_1 + R_2 + R_e + X_{he}\times L}.$$

In the above equations, $Z_{OA}$, $Z_{OB}$, and $Z_{OC}$ denote self-impedance of cable sheaths; $R_1$ and $R_2$ denote ground resistance at a beginning of the cable sheath and at an end of the cable sheath; $R_e$ denotes earth leakage resistance; and $X_{he}$ denotes mutual inductance of the earth leakage current with respect to the cable sheath.

The capacitive current of the cable is $I_2 = j\omega CU$, where $\omega$ denotes the angular frequency, C denotes a capacitance of the cable, and U denotes cable voltage.

$I_3$ denotes induced current change of the cable sheath according to load current fluctuation, and $I_3$ may be recorded online by the power-cable ground current real-time sampling device.

Based on equation $I_d = I_1 + I_2 + I_3$, a minimum valid monitoring value, also referred to as the sampling baseline, is obtained, and is configured in the backend monitoring device for the power-cable ground current.

Step (2) An impact factor set of sample data may be determined.

The impact factor set may be represented as $U=\{U_1,U_2\}$, where $U_1=\{u_{11},u_{12}\}$, $u_{11}$ denotes a time point in a day; $u_{12}$ denotes a time period in a year; $U_2=\{u_{21},u_{22},u_{23}\}$; $u_{21}$ denotes a dispatch quota; $u_{22}$ denotes a dispatch duration; and $u_{23}$ denotes a dispatch impact factor.

Step (3) The power-cable ground current real-time sampling device may sample the ground current data in real-time.

Step (4) A digital filter may perform digital filtering on the sample data of the real-time power-cable ground current. The function model of the digital filter is:

$$|H(i)|^2 = \frac{1}{1+\left(\frac{i}{i_c}\right)^{2n}} = \frac{1}{1+\varepsilon^2\left(\frac{i}{i_p}\right)^{2n}}$$

In the above equation, n denotes a filter order; $i_c$ denotes a cutoff value as of the ground current; and $i_p$ denotes a band-pass edge of the ground current.

Step (4) A self-adaptive algorithm may be applied to process the filtered sample data, the algorithm is $$\begin{cases} |H(i)|^2 = \dfrac{1}{1+\left(\dfrac{i}{i_c}\right)^{2n}} = \dfrac{1}{1+\varepsilon^2\left(\dfrac{i}{i_p}\right)^{2n}} \\ i_c = i_d + \theta \Delta I - r \\ \theta = \{U_1, U_2\} \end{cases}$$

In the above equation, $\Delta I$ denotes difference between a present ground current measurement value and $i_d$; r denotes a rate-adjusting variable which is introduced based on changes of loads on the cable lines in operation; and $\theta$ denotes the impact factor set.

Step (6) The processed sample data may be uploaded to the backend monitoring device for real-time monitoring.

Further, in the above-mentioned step (2), impact factor coefficients corresponding to the time points in the day $u_{11}$ are established and divided into gradually-increased five grades, including grades I, II, III, IV, and V, wherein values of the impact factor coefficients range from 0.8 to 1.2. Impact factor coefficients corresponding to the time periods in the year $u_{12}$ are divided into gradually-increased five grades, including grades I, II, III, IV, and V, wherein values of the impact factor coefficients range from 0.96 to 1.0. The dispatch quota $u_{21}$ and the dispatch duration $u_{22}$ are divided into three grades including, from low to high, grades S, M, and L, wherein values of the dispatch impact factor $u_{23}$ corresponding to the three grades are respectively 0.9, 1.0, and 1.1.

Further, in the above-mentioned step (5), the range of the rate-adjusting variable r may be $(-i_r, i_r)$, where $i_r=(I_{max}-I_{min})\times 5\%$. In the previous equation, $I_{max}$ denotes a maximum load during operation, and $I_{min}$ denotes a minimum load during operation.

Laying arrangements of individual power lines may be considered when determining specific values of rate-adjusting variable r, and the rate-adjusting variable r may be determined according to field measurements.

BRIEF DESCRIPTION OF THE DRAWINGS

FIG. 1 illustrates a flow chart of the method in the present invention;

DETAILED DESCRIPTION

Drawings and embodiments are combined to further describe the present disclosure.

Embodiment 1

The present embodiment provides a power-cable ground current self-adaptive monitoring method, which may be implemented by an existing power-cable ground current monitoring system in power supply departments. The power-cable ground current monitoring system may include a power-cable ground current real-time sampling device and a backend monitoring device. The present embodiment uses ground cables laid horizontally as an example, and provides a self-adaptive monitoring method.

As shown in FIG. 1, the power-cable ground current self-adaptive monitoring method may mainly include the following steps.

Step 1: configuring a sampling baseline.

Determining a minimum valid monitoring value may refer to determining a sampling baseline. According to characteristics of cable structure designs, grounding interval length, cable voltage level, load current, and inherent parameters of the cable body may be mainly considered when configuring the sampling baseline of ground currents. Provided that D denotes the diameter of the metal layer of a cable, S denotes distance between centers of cables, L denotes cable length, I denotes operating current, $\omega$ denotes angular frequency, three-phase induced electromotive force of ground cables A, B, and C corresponding to the three phases may be obtained by:

$$E_B = I l 2\omega \left(\ln\frac{2S}{D}\right) \times 10^{-7},$$

$$E_A = E_C = I l \sqrt{\frac{\left(2\omega\left(\ln\frac{2S}{D}\right)\times 10^{-7}\right)^2 + 2\omega\left(\ln\frac{2S}{D}\right)\times 10^{-7} \times}{2\omega(\ln 2)\times 10^{-7} + (2\omega(\ln 2)\times 10^{-7})^2}}.$$

Based on the three-phase induced electromotive force (EMF), three-phase induced current $I_1$ may be obtained with the following equations.

$$I_{1A} = \frac{E_A}{Z_{OA} + R_1 + R_2 + R_e + X_{he} \times L}$$

$$I_{1B} = \frac{E_B}{Z_{OB} + R_1 + R_2 + R_e + X_{he} \times L}$$

$$I_{1C} = \frac{E_C}{Z_{OC} + R_1 + R_2 + R_e + X_{he} \times L}$$

where $Z_{OA}$, $Z_{OB}$, and $Z_{OC}$ denote self-impedance of cable sheaths; $R_1$ and $R_2$ denote ground resistance at the beginning of the cable sheath and at the end of the cable sheath; $R_e$ denotes earth leakage resistance; and $X_{he}$ denotes mutual inductance of the earth leakage current with respect to the cable sheath.

Capacitor-like effect may exist between cables of different phases, and between a cable of one phase and its sheath. When cables are charged, a small current may occur. The small current is the capacitive current of the cable. The capacitive current may be obtained by $I_2=j\omega CU$, where $\omega$ denotes angular frequency, C denotes capacitance of the cable, and U denotes cable voltage.

$I_3$ denotes change of induced current of the cable sheath according to load current fluctuation. $I_3$ may be recorded by an online monitoring method.

Based on electrical characteristics of cables, current in the ground cables may be a combination of induced current, capacitive current, current affected by load fluctuation, and leakage current. The induced current, the capacitive current and current affected by load fluctuation may be used for obtaining the sampling baseline: $I_d=I_1+I_2+I_3$. That is, the to-be-configured minimum valid monitoring value may be obtained.

Step 2: an impact factor set of the sampling data may be obtained.

According to situations that power lines have load fluctuations, an analysis model of influence levels of load fluctuations on the ground current may be established. The load fluctuation may be affected by time profile and dispatch quota. The determination method may include the following.

The impact factor set is denoted by $U=\{U_1,U_2\}$, where $U_1=\{u_{11},u_{12}\}$; $u_{11}$ denotes a time point in the day; $u_{12}$ denotes a time period in the year; $U_2=\{u_{21},u_{22},u_{23}\}$; $u_{21}$ denotes dispatch quota; $u_{22}$ denotes dispatch duration, $u_{23}$ denotes dispatch impact factor. Impact factor coefficients corresponding to time points during the day $u_{11}$ may be established. Based on the different impact level, impact factor coefficients may be divided into gradually-increased five grades or levels, including grades I, II, III, IV, and V. The grade ranking of $u_{11}$ may be influenced by the power load. Heavier power load may be associated with larger impact factor coefficient. Here, grade III represents an average daily load, and its corresponding impact factor coefficient is 1.0. According to the decreasing or increasing of the power load, the impact factor may range from 0.8 to 1.2. The grade ranking of $u_{12}$ may be influenced by operation duration of the power line. Longer operation duration may be associated with larger impact factor coefficient, and its maximum value is 1.0.

| First level indicator $U_i$ | Second level indicator | I | II | III | IV | V |
|---|---|---|---|---|---|---|
| Time condition $U_1$ | Time point in the day $u_{11}$ | 0.8 | 0.9 | 1.0 | 1.1 | 1.2 |
| | Time period in the year $u_{12}$ | 0.96 | 0.97 | 0.98 | 0.99 | 1.0 |

Dispatch influences may be directly reflected by the dispatch quota. The impact factors may be adjusted based on volume of the dispatch quota and duration of the dispatch. In the following table, S, M, and L respectively represents three grades from low to high. Based on different combinations, the dispatch impact factor coefficients may range from 0.9 to 1.1.

| First level indicator $U_i$ | Second level indicator | | | | | |
|---|---|---|---|---|---|---|
| Load condition $U_2$ | Dispatch quota $u_{21}$ | L | S | M | L | S |
| | Dispatch duration $u_{22}$ | L | L | M | S | S |
| | Dispatch impact factor $u_{23}$ | 1.1 | 1.0 | 1.0 | 1.0 | 0.9 |

The grade ranking method disclosed in the present embodiment may be dynamically adjusted based on actual situations at different field locations, which may be suitable to specific application scenarios, enhance effectiveness of data sampling, and effectively reduce objective interferences during value determination process.

Step 3: the power-cable ground current real-time sampling device may sample the ground current in real-time.

Step 4: a digital filter may perform digital filtering on the sampled real-time power-cable ground current data.

To avoid data interferences brought by sharp pulse signals and noise signals in the process of monitoring power cables, combining lagging characteristics of the ground current data, the sampled data may be filtered digitally. The function model of the digital filter is $$|H(i)|^2 = \frac{1}{1+\left(\frac{i}{i_c}\right)^{2n}} = \frac{1}{1+\varepsilon^2\left(\frac{i}{i_p}\right)^{2n}}$$

In the equation, n denotes the filter order; $i_c$ denotes a cutoff value of the ground current; and $i_p$ denotes band-pass edge value of the ground current.

Step 5: a self-adaptive algorithm may be applied to process the filtered sample data. The algorithm is $$\begin{cases} |H(i)|^2 = \dfrac{1}{1+\left(\frac{i}{i_c}\right)^{2n}} = \dfrac{1}{1+\varepsilon^2\left(\frac{i}{i_p}\right)^{2n}} \\ i_c = i_d + \theta\Delta I - r \\ \theta = \{U_1, U_2\} \end{cases}$$

In the equation, $\Delta I$ denotes difference between a present ground current measurement value and $i_d$; $\theta$ denotes the impact factor set; and r denotes a rate-adjusting variable.

The self-adaptive algorithm may effectively filter out sampled data having low amount of information and low credibility.

The previously-described rate-adjusting variable r may have a range of $(-i_r, i_r)$, where $i_r=(I_{max}-I_{min})\times 5\%$. In the equation, $I_{max}$ denotes maximum load during operation, $I_{min}$ denotes minimum load during operation. Laying arrangements of individual power lines may be considered when determining specific values of the rate-adjusting variable r. The rate-adjusting variable r may be determined according to field measurements.

Step 6: the processed sample data may be uploaded to the backend monitoring device for real-time monitoring.

The above examples describe specific embodiments of the invention, and should not limit the invention. Those skilled in the art without departing from the spirit and scope of the present invention also can make various changes and variations to give corresponding equivalent technical solution. Therefore, all equivalent technical solution should be included in the scope of the invention.

INDUSTRIAL APPLICABILITY AND ADVANTAGEOUS EFFECTS

The present invention has various advantageous effects. (1) The power-cable ground current self-adaptive monitoring method disclosed in the present invention, different from existing methods which directly uses monitoring time intervals as data sampling frequency, applies a data grade ranking method, combines inherent characteristics of cables and relationships with load, and establishes a self-adaptive monitoring and sampling analysis method. The present invention may solve problems during the monitoring process including high energy loss and low amount of information in monitoring data, and may enhance efficiencies of evaluating external insulation status of the cables.

(2) The power-cable ground current self-adaptive monitoring method disclosed in the present invention provides a novel impact factor set, which is a grade ranking criterion. The impact factor set may be dynamically corrected based on actual operation of power lines, and may reduce objective interferences during the value determination process. The monitoring accuracy is relatively high.

(3) The power-cable ground current self-adaptive monitoring method disclosed in the present invention may effectively reduce power consumption of monitoring device by more than 50%, and lower server resource occupancy percentage by about 20%.

What is claimed is:

1. A power-cable ground current self-adaptive monitoring method for reducing energy loss during a monitoring process and increasing monitoring accuracy and efficiency, implemented by a power-cable ground current monitoring system, the power-cable ground current monitoring system including a power-cable ground current real-time sampling device and a backend monitoring device, comprising:

step (1): configuring, at the backend monitoring device, a sampling baseline as a minimum valid monitoring value according to inherent physical characteristics of ground cables, wherein:

three-phase induced electromotive forces (EMF) of the ground cables A, B, and C are obtained by:

$$E_B = l2\omega\left(\ln\frac{2S}{D}\right) \times 10^{-7},$$

$$E_A = E_C = l\sqrt{\left(2\omega\left(\ln\frac{2S}{D}\right) \times 10^{-7}\right)^2 + 2\omega\left(\ln\frac{2S}{D}\right) \times 10^{-7} \times 2\omega(\ln 2) \times 10^{-7} + (2\omega(\ln 2) \times 10^{-7})^2},$$

wherein D denotes a diameter of a metal layer of a cable; S denotes a distance between centers of the ground cables; l denotes a cable length; I denotes a cable operating current; and $\omega$ denotes an angular frequency;

based on the three-phase induced electromotive forces, three-phase induced currents $I_1$ are obtained by:

$$I_{1A} = \frac{E_A}{Z_{OA} + R_1 + R_2 + R_e + X_{he} \times L},$$

$$I_{1B} = \frac{E_B}{Z_{OB} + R_1 + R_2 + R_e + X_{he} \times L},$$

$$I_{1C} = \frac{E_C}{Z_{OC} + R_1 + R_2 + R_e + X_{he} \times L},$$

wherein $Z_{OA}$, $Z_{OB}$, and $Z_{Oc}$ denote the self-impedance of cable sheaths; $R_1$ and $R_2$ denote the ground resistance at a beginning of the cable sheath and at an end of the cable sheath; $R_e$ denotes earth leakage resistance; and $X_{he}$ denotes mutual inductance of the earth leakage current with respect to the cable sheath;

a capacitive current of the cable is $I_2 = j\omega CU$, wherein $\omega$ denotes the angular frequency, C denotes a capacitance of the cable, and U denotes cable voltage;

$I_3$ denotes an induced current change of the cable sheath according to load current fluctuation, and $I_3$ is recorded online by the power-cable ground current real-time sampling device; and based on equation $I_d = I_2 + I_3$, a minimum monitoring valid value, also referred to as the sampling baseline, is obtained, and is configured in the backend monitoring device for the power-cable ground current;

step (2): determining an impact factor set of a sample data based on actual operation of a power line, the impact factor set reflecting a sampling time of the actual operation and dispatch conditions of the power line in the actual operation, wherein:

the impact factor set is denoted as $U = \{U_1, U_2\}$, wherein: $U_1 = \{u_{11}, u_{12}\}$, $u_{11}$ denotes a time point in a day; $u_{12}$ denotes a time period in a year; $U_2 = \{u_{21}, u_{22}, u_{23}\}$; $u_{21}$ denotes a dispatch quota; $u_{22}$ denotes a dispatch duration; and $u_{23}$ denotes a dispatch impact factor;

step (3): sampling, by the power cable ground current real-time sampling device, data of the ground current in real-time;

step (4): performing, by a digital filter of the power-cable ground current real-time sampling device, digital filtering on the sample data of the real-time power-cable ground current obtained in step (3), wherein a function model of the digital filter is:

$$|H(i)|^2 = \frac{1}{1 + \left(\frac{i}{i_c}\right)^{2n}} = \frac{1}{1 + \varepsilon^2 \left(\frac{i}{i_p}\right)^{2n}},$$

wherein, n denotes a filter order; $i_c$ denotes a cutoff value of the ground current; and $i_p$ denotes a band-pass edge of the ground current;

step (5): applying, by the power-cable ground current real-time sampling device, a self-adaptive algorithm that combines lagging characteristics of the ground current data to process the sample data and filter out sample data having low amount of information and low credibility and to avoid data interferences brought by sharp pulse signals and noise signals in a process of monitoring power cables, according to the function model of the digital filter in step (4), the sampling baseline obtained in step (1) based on the inherent physical characteristics of the horizontally-laid ground cables to process the ground current of the sample data against the minimum valid monitoring value, the impact factor set obtained in step (2) based on the actual operation of the power line to adjust the cutoff value of the ground current according to the sampling time of the actual operation and dispatch conditions of the power line in the actual operation, and power load, wherein the self-adaptive algorithm is $$\begin{cases} |H(i)|^2 = \cfrac{1}{1+\left(\cfrac{i}{i_c}\right)^{2n}} = \cfrac{1}{1+\varepsilon^2\left(\cfrac{i}{i_p}\right)^{2n}} \\ i_c = i_d + \theta\Delta I - r \\ \theta = \{U_1, U_2\} \end{cases},$$

wherein $\Delta I$ denotes a difference between a present ground current measurement value and the sampling baseline $i_d$; $\theta$ denotes the impact factor set; and r denotes a rate-adjusting variable corresponding to the power load; and step (6): uploading the filtered sample data to the backend monitoring device for real-time monitoring, such that sample data having low amount of information and low credibility are filtered out in step (5), not all data sampled by the power cable ground current real-time sampling device are uploaded and server resource occupancy of the backend monitoring device are reduced.

2. The power-cable ground current self-adaptive monitoring method according to claim 1, wherein in step (2):

impact factor coefficients corresponding to the time points in the day $u_{11}$ are established and divided into gradually-increased five grades, including grades I, II, III, IV, and V, wherein values of the impact factor coefficients range from 0.8 to 1.2;

impact factor coefficients corresponding to the time periods in the year $u_{12}$ are divided into gradually-increased five grades, including grades I, II, III, IV, and V, wherein values of the impact factor coefficients range from 0.96 to 1.0; and the dispatch quota $u_{21}$ and the dispatch duration $u_{22}$ are divided into three grades including, from low to high, grades S, M, and L, wherein values of the dispatch impact factor $u_{23}$ corresponding to the three grades are respectively 0.9, 1.0, and 1.1.

3. The power-cable ground current self-adaptive monitoring method according to claim 1, wherein in step (5):

the rate-adjusting variable r have a range of $(-i_r, i_r)$ wherein $i_r=(I_{max}-I_{min})\times 5\%$, wherein $I_{max}$ denotes a maximum load during operation, and $I_{min}$ denotes a minimum load during operation.

4. A power-cable ground current self-adaptive monitoring method for reducing energy loss during a monitoring process and increasing monitoring accuracy and efficiency, implemented by a power-cable ground current monitoring system, the power-cable ground current monitoring system including a power-cable ground current real-time sampling device and a backend monitoring device, comprising:

configuring a sampling baseline of power-cables in three-phase transmission in the backend monitoring device as a minimum valid monitoring value according to inherent physical characteristics of ground cables, wherein the sampling baseline of a power-cable is obtained by combining an induced current of the power-cable, a capacitive current of the power-cable, and an induced current change of a cable sheath based on load current fluctuation;

determining an impact factor set of sample data based on actual operation of a power line, wherein the impact factors reflect a sampling time of the actual operation and dispatch conditions of the power line in the actual operation, and include time points in a day, time periods in a year, dispatch quota, dispatch duration, and dispatch impact factor;

sampling, by the power-cable ground current real-time sampling device, data of ground current of the power-cables in real-time;

applying, by the power-cable ground current real-time sampling device, a self-adaptive algorithm to process the sample data and filter out sample data having low amount of information and low credibility according to a function model of a digital filter implemented by the power-cable ground current real-time sampling device, the sampling baseline obtained based on the inherent physical characteristics of the ground cables to process the ground current of the sample data against the minimum valid monitoring value, the impact factor set obtained based on the actual operation of the power line to adjust the cutoff value of the ground current according to the sampling time of the actual operation and dispatch conditions of the power line in the actual operation, and power load, wherein the self-adaptive algorithm incorporates the impact factor set and a rate-adjusting variable corresponding to the power load during operation; and uploading the filtered sample data to the backend monitoring device for real-time monitoring, such that sample data having low amount of information and low credibility are filtered out using the self-adaptive algorithm, not all data sampled by the power cable ground current real-time sampling device are uploaded and server resource occupancy of the backend monitoring device are reduced.

5. The method according to claim 4, wherein:

impact factor coefficients corresponding to the time points in the day are divided into a plurality of grades;

impact factor coefficients corresponding to the time periods in the year are divided into are divided into a plurality of grades; and the dispatch quota and the dispatch duration are divided into a plurality of grades, and the dispatch impact factor is determined based on a combination of a grade of the dispatch quota and a grade of the dispatch duration.

6. The method according to claim 5, wherein:

values of the impact factor coefficients corresponding to the time points in the day range from 0.8 to 1.2;

values of the impact factor coefficients corresponding to the time periods in the year range from 0.96 to 1.0; and values of the dispatch impact factor range from 0.9 to 1.1.

7. The method according to claim 4, wherein:

the rate-adjusting variable is determined according to field measurements.

8. The method according to claim 4, wherein:

the rate-adjusting variable r have a range of $(-I_r, i_r)$; and $i_r=(I_{max}-I_{min})\times 5\%$, wherein $I_{max}$ denotes a maximum load during operation, and $I_{min}$ denotes a minimum load during operation.

9. The method according to claim 8, wherein:

the function model of the digital filter is:

$$|H(i)|^2 = \cfrac{1}{1+\left(\cfrac{i}{i_c}\right)^{2n}} = \cfrac{1}{1+\varepsilon^2\left(\cfrac{i}{i_p}\right)^{2n}},$$

wherein, n denotes a filter order; $i_c$ denotes a cutoff value as of the ground current; and $i_P$ denotes a band-pass edge of the ground current.

10. The method according to claim 9, wherein:
the self-adaptive algorithm is $$\begin{cases} |H(i)|^2 = \dfrac{1}{1+\left(\dfrac{i}{i_c}\right)^{2n}} = \dfrac{1}{1+\varepsilon^2\left(\dfrac{i}{i_p}\right)^{2n}} \\ i_c = i_d + \theta \Delta I - r \\ \theta = \{U_1, U_2\} \end{cases},$$

wherein $i_d$ denotes the configured sampling baseline, $\Delta I$ denotes a difference between a present ground current measurement value and $i_d$; $\theta$ denotes the impact factor set; and r denotes the rate-adjusting variable; the impact factor set is denoted as $U=\{U_1,U_2\}$, wherein: $U_1=\{u_{11},u_{12}\}$, $u_{11}$ denotes a time point in the day; $u_{12}$ denotes a time period in the year; $U_2=\{u_{21},u_{22},u_{23}\}$; $u_{21}$ denotes the dispatch quota; $u_{22}$ denotes the dispatch duration; and $u_{23}$ denotes the dispatch impact factor.

11. The method according to claim 4, wherein:
the induced current change of the cable sheath based on load current fluctuation is recorded online by the power-cable ground current real-time sampling device.

\* \* \* \* \*